US008040270B2

(12) United States Patent
Rao et al.

(10) Patent No.: US 8,040,270 B2
(45) Date of Patent: Oct. 18, 2011

(54) LOW-NOISE DATA ACQUISITION SYSTEM FOR MEDICAL IMAGING

(75) Inventors: Naresh Kesavan Rao, Clifton Park, NY (US); Richard Gordon Cronce, New Berlin, WI (US); Jianjun Guo, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 159 days.

(21) Appl. No.: 12/393,762

(22) Filed: Feb. 26, 2009

(65) Prior Publication Data

US 2010/0215146 A1    Aug. 26, 2010

(51) Int. Cl.
*H03M 1/12* (2006.01)
(52) U.S. Cl. ............... 341/172; 341/155; 341/156
(58) Field of Classification Search .......... 341/172, 341/155, 156, 120
See application file for complete search history.

(56) References Cited

U.S. PATENT DOCUMENTS

| | | | |
|---|---|---|---|
| 4,399,426 A * | 8/1983 | Tan ..................... | 341/120 |
| 6,087,970 A * | 7/2000 | Panicacci ............... | 341/172 |
| 6,324,244 B1 | 11/2001 | Lauter et al. | |
| 6,590,513 B2 | 7/2003 | Stetson et al. | |
| 6,914,701 B2 | 7/2005 | Lehman | |
| 7,002,408 B2 | 2/2006 | Roos et al. | |
| 7,053,806 B1 | 5/2006 | Rao et al. | |
| 7,175,092 B2 | 2/2007 | Pettinelli, Jr. et al. | |
| 7,180,366 B2 | 2/2007 | Roos et al. | |
| 7,208,717 B2 | 4/2007 | Partain et al. | |
| 7,253,755 B1 | 8/2007 | Fette | |
| 7,321,847 B1 | 1/2008 | Welkie et al. | |
| 2003/0063026 A1* | 4/2003 | Nandy ............... | 341/172 |
| 2006/0139198 A1 | 6/2006 | Rao et al. | |
| 2008/0055728 A1 | 3/2008 | Tanaka et al. | |

FOREIGN PATENT DOCUMENTS

WO    WO9828859    2/1998

OTHER PUBLICATIONS

Hoe, David H. et al.; "An Auto-Ranging Photodiode Preamplifier with 114 dB Dynamic Range", IEEE Journal on Solid-State Circuits, vol. 31, No. 2, Feb. 1996.

* cited by examiner

*Primary Examiner* — Jean Jeanglaude
(74) *Attorney, Agent, or Firm* — Scott J. Asmus

(57) ABSTRACT

According to embodiments of the present technique, a system and a method for obtaining low-noise measurements for a wide range of analog signal strengths is provided. According to aspects of the present technique, a low-gain measurement of an input pixel charge is performed, wherein the input pixel charge is distributed to two feedback capacitors, which together provide a relatively low integrator gain. After the low-gain measurement, a high-gain measurement is performed, wherein one of the capacitors is remove from the feedback loop and the charge is redistributed to the remaining capacitor.

15 Claims, 6 Drawing Sheets

US 8,040,270 B2

LOW-NOISE DATA ACQUISITION SYSTEM FOR MEDICAL IMAGING

BACKGROUND

The invention relates generally to signal processing, and more particularly to systems and methods for reducing the noise floor in digital X-ray imaging systems.

A number of radiological imaging systems of various designs are known and are presently in use. Certain of these systems are based upon generation of X-rays that are directed toward a subject of interest. The X-rays traverse the subject and, in digital imaging system, impact a digital detector. Such X-ray systems use digital circuitry for detecting the X-rays, which are attenuated, scattered or absorbed by the intervening structures of the subject. In medical diagnostic contexts, for example, such systems may be used to visualize internal tissues and diagnose patient ailments. In other contexts, parts, baggage, parcels, and other subjects may be imaged to assess their contents and for other purposes.

Basic radiographic X-ray systems may be designed for generating projection images only. Such projection images may be presented as a well-known reverse image, although the image data itself is subject to various presentations. In addition to radiographic X-ray systems, fluoroscopy systems, computed tomography systems, and tomosynthesis (CT) systems that are based on similar X-ray radiation generation and detection are also used to generate images. In fluoroscopy systems, for example, a low dose X-ray signal may be used to generate a real-time moving image.

Quantum and electronic noise in the measurement system may tend to cause various artifacts in the radiological data collected in any one of the foregoing types of systems. Such artifacts are not only distracting, but may impair effective use of the images, such as for diagnosis in a medical context. In particular, such artifacts may make small or more detailed features that would otherwise be visible in the images, difficult to detect and discern. Therefore, reducing the noise floor may result in improved image quality and also enable lower dose protocols.

In applications such as mammography and radiography, the X-ray source energy is high, and the gain of the receiving electronics is relatively low. This allows the receiver to generate an image with a high dynamic range. In such systems, the noise floor is dominated by intrinsic X-ray quantum noise, and the noise generated by the electronics is not as important. In applications such as fluoroscopy systems, the X-ray source energy is low and the gain of the receiver circuitry is relatively high. This reduces the overall X-ray exposure to the patient, while still producing a suitable image. In these types of systems, the noise floor is dominated by the receive circuitry.

Existing techniques for reducing the noise floor in a variety of applications are typically tailored to adapt to a given X-ray application, based on the strength of the X-ray source signal. Accordingly, multiple image processing platforms may have to be developed, each with a different noise reduction technique depending on the X-ray application.

It would be advantageous, therefore, to provide improved techniques for reducing noise in radiological image data that may be used for a wide range of signal levels, thus allowing a single image processing platform to be used with a wide range of X-ray applications.

BRIEF DESCRIPTION

According to embodiments of the present technique, a system and a method for obtaining low-noise measurements for a wide range of analog signal strengths are provided. According to one aspect of the present technique, a low-gain measurement of an input pixel charge is performed, wherein the input pixel charge is distributed to two feedback capacitors, which together provide a relatively low integrator gain. After the low-gain measurement, a high-gain measurement is performed, wherein one of the capacitors is removed from the feedback loop and the charge is redistributed to the remaining capacitor. In another embodiment, the input pixel charge is initially distributed into two feedback capacitors and the output of the integrator is measured to determine whether the gain of the integrator should be increased. If so, one of the capacitors is removed from the feedback loop and the charge is redistributed to the remaining capacitor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In the subsequent paragraphs, various aspects of a low-noise technique for signal conversion will be explained in detail. The various aspects of the present technique will be explained, by way of example only, with the aid of figures hereinafter. The present low-noise technique for conversion of analog signals to digital signals will generally be described by reference to an exemplary digital X-ray system designated generally by numeral 10. It should be borne in mind, however, that the technique may find application in a range of settings and systems, and that its use in the X-ray system shown is but one such application.

Figure 1:
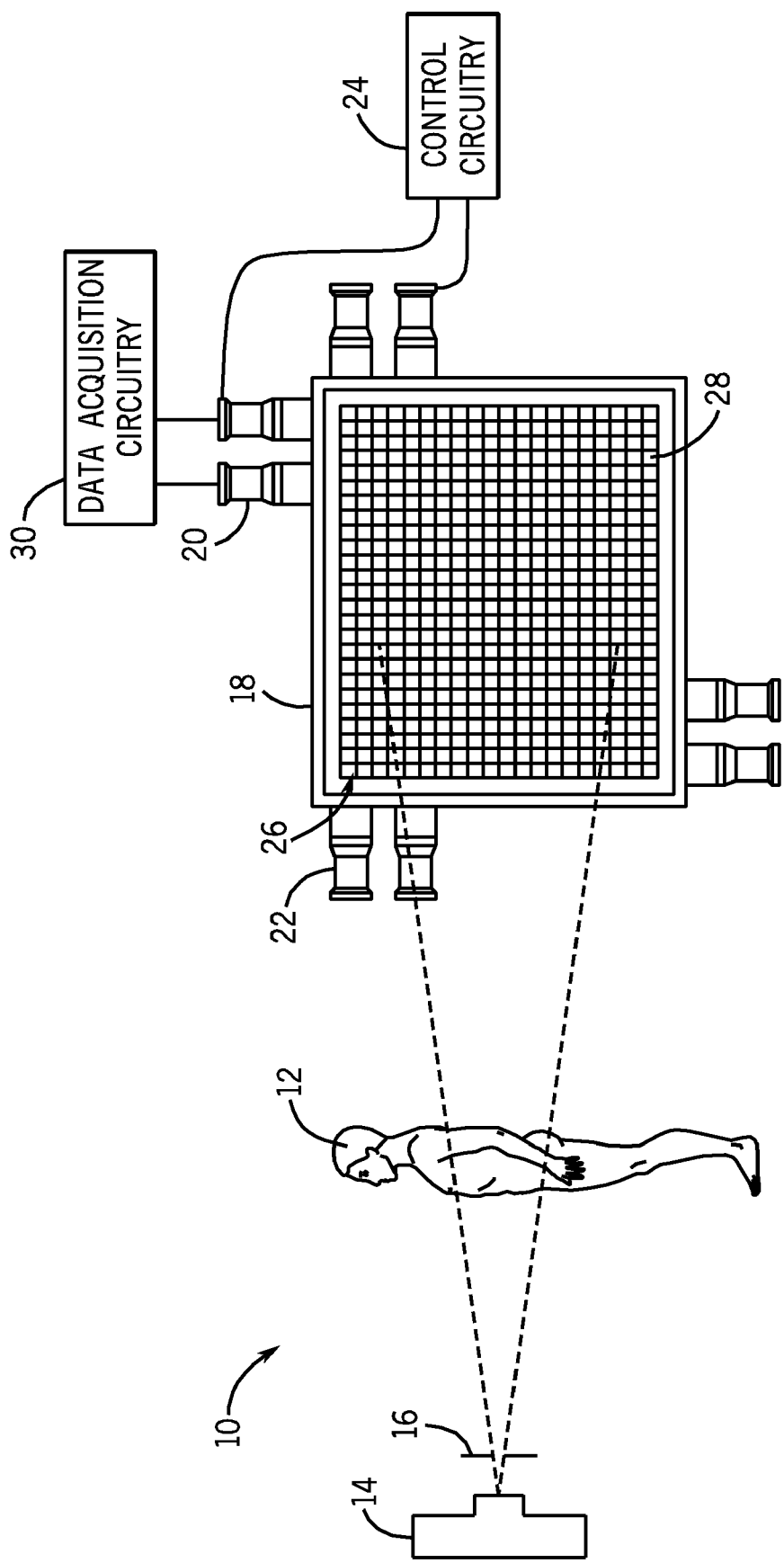
FIG. 1 is a diagrammatic view of an exemplary digital X-ray system, in which improved noise reduction techniques are implemented in accordance with aspects of the present invention.

The digital X-ray system 10 of FIG. 1 is operable to capture an X-ray projection of a portion of the body of a subject 12 under medical examination. However, as will be appreciated by those skilled in the art, the digital X-ray system 10 may also be utilized for non-destructive evaluation (NDE) of materials, such as castings, forgings, or pipelines, inspection of parts, parcels and baggage, and other such applications. The digital X-ray system 10 comprises an X-ray source 14 that is used to scan the subject 12. The X-ray source 14 generates X-ray beams that pass through a collimator 16 and then penetrate through the subject 12. In a typical medical application, the X-ray beams may be attenuated based on the density of the organs, skin, lesions, muscle, bones and the like, in the various portions of the body of the subject 12. The attenuated X-rays are captured by a digital X-ray panel 18, as illustrated in FIG. 1, which comprises a plurality of photodiodes that form a pixel array. The panel 18 is read row-by-row or column-by-column by one or more data modules 20, where each line of pixels may be enabled for scanning, by one or more scan modules 22. Control circuitry 24 is used to control the operation of the data modules 20 and the scan modules 22.

The digital X-ray panel 18 comprises a plurality of rows 26, each of which contains a plurality pixels 28 arranged contiguously to form a pixel matrix or a pixel array. In embodiments, each pixel includes a radiation detection element such as a photodiode. During operation of the X-ray panel 18, received X-ray radiation is converted to a lower energy form, and each of the pixel 28 photodiodes has an initial charge that is depleted by an amount representative of the amount of X-ray radiation incident on the respective location of each pixel 28. The data modules 20 read the amount of charge from each of the pixel 28. Each row 26 is scanned by the data modules 20 in conjunction with the scan modules 22 to read the amount of charge from all the pixels 28 in that row 26 (or column). The scan module 22 corresponding to a row 26 enables reading the pixels 28 in that row 26. When the pixel 28 is enabled for reading, the data module 20 corresponding to that pixel 28 reads the charge stored on the photodiode or pixel 28 by recharging the photodiode. Having read the charge value from the plurality of pixels 28, the data module 20 converts the charge value into a digital equivalent that is sent to data acquisition circuitry 30 for further processing such as generating an radiological image or projection, for example.

The digital x-ray system 10 may be a radiography system, mammography system, floroscopy system, or may be a system that combines the functionality of several X-ray applications. As discussed above, the energy intensity of the X-ray source 14 may vary according to which application is being employed in the digital x-ray system 10. The data modules 20 described herein may be used with a variety of x-ray applications regardless of the X-ray energy intensity employed. This allows one data module to be used in a variety of imaging systems, resulting in higher economies of scale and reduced production costs.

Figure 2:
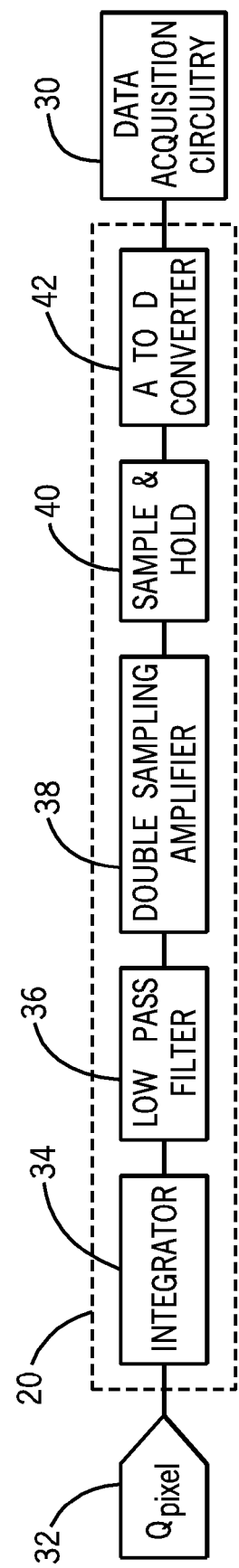
FIG. 2 is a diagrammatic view of an exemplary digital conversion system for the digital X-ray system shown in FIG. 1 with improved techniques for reducing noise in accordance with aspects of the present invention.
Figure 3:
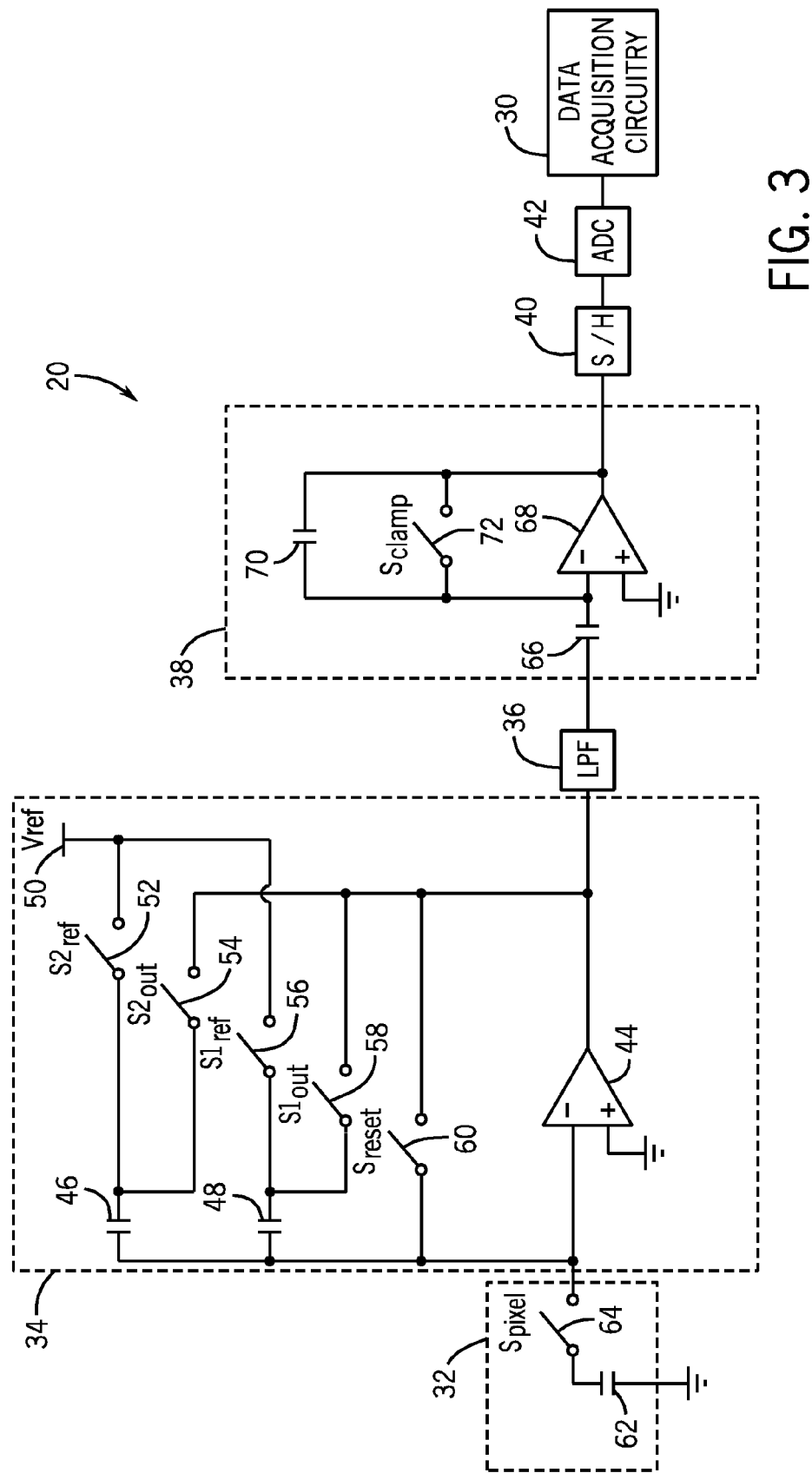
FIG. 3 is a detailed diagrammatic view of the exemplary digital conversion system shown in FIG. 2, illustrating one technique for reducing noise in accordance with aspects of the present invention.

FIG. 2 is a diagrammatic view of the exemplary data module 20 as shown in FIG. 3, in accordance with aspects of the present techniques. Each data module 20 is configured to read an input pixel charge 32 from a photodiode or pixel 28 and provide the digital equivalent to the data acquisition circuitry 30. In some embodiments, the data module 20 may include several processing channels, each coupled to an individual pixel 28 and configured to process the pixel charge 32 from the respective pixel 28. The data acquisition circuitry 30 receives the digital data from the data modules 20 and processes the data to form an image. In the depicted embodiment, each data module 20 comprises an integrator 34, which integrates the pixel charge 32 for conversion into an equivalent voltage value which is fed into a low-pass-filter 36 for reducing noise. The voltage signal output from the low-pass filter 36 is fed into a double sampling amplifier (DSA) 38. The output of the DSA 38 is sampled and held in a sample-and-hold (S/H) circuit 40. The DSA 38 in conjunction with the integrator 34 may enable a measurement technique referred to as "correlated double sampling" which serves to reduce offset and flicker noise.

The output of the S/H circuit 40 may be fed into an analog to digital converter (ADC) 42 that converts the measured analog signal(s) to a digital format and sends the data to the data acquisition circuitry 30 for further processing. The ADC 42 may be any suitable analog to digital converter. In some embodiments, the ADC 42 may include a comparator, a digital to analog converter (DAC), a counter, and a register. In this embodiment, the comparator provides either a high or a low output based on a comparison of the voltage output of the S/H circuitry 40 and a comparison signal provided by the DAC. The register is provided with a counter value from the counter that is proportional to the digital code provided to the DAC for generating the comparison signal. The counter value and the digital code provided to the DAC are both incremented over time so that the comparison signal gradually increases. The output of the comparator may be configured to freeze the counter value in the register when the output of the S/H circuit 40 and the comparison signal are equal. Because the counter value provided to the DAC and the register are proportional, the frozen counter value in the register is representative of the digitized output of the input pixel charge 32 of the corresponding pixel 28. The starting point of the comparison signal will therefore determine, in part, how quickly the output of the S/H circuit may be digitized.

It may be noted that the integrator 34, the low-pass filter 36, the DSA 38, the S/H circuit 40 and the ADC 42 may comprise a single channel that reads a single photodiode or pixel 28. Each data module 20 may include several such channels. In some embodiments, the data module may include enough channels to enable the reading and digitizing of P pixels simultaneously. Thus, if a row of M pixels has to be read simultaneously, M/P data modules 20 may be employed.

The circuit describe above may be subject to several noise sources, such as quantum noise and electronic noise, for example. Electronic noise is noise generated in the electronics of the digital X-ray system 10. Electronic noise and offsets may be reduced through calibration techniques such as the correlated double sampling technique. Quantum noise is the noise intrinsic to an X-ray image and may not be reduced by the correlated double sampling technique. The amount of quantum noise produced by an X-ray beam is equal to the square root of the number of X-rays incident on the detector 16. Therefore, at high X-ray flux, the digital X-ray system 10 may be prone to more quantum noise and relatively less electronic noise, making the correlated double sampling technique less important for measuring high energy X-rays. As will be described below, embodiments of the present technique successfully reduce electronic noise for low-energy (high-gain) X-ray measurements via the correlated double sampling method, while also enabling high-energy (low-gain) measurements of the same input pixel charge.

FIG. 3 is a more detailed diagrammatic view of the exemplary data module 20 shown in FIG. 2, illustrating one technique for reducing noise in accordance with present embodiments. In this embodiment, the pixel charge 32, $Q_{pixel}$, may be held in a pixel capacitor 62 and may be coupled to the input of integrator 34 by a pixel switch 64, $S_{pixel}$. In the embodiment depicted, the integrator 34 comprises an operational amplifier (op-amp) 44 with two integration capacitors 46 and 48 in a feedback loop. The capacitors 46 and 48 are both coupled to the negative input terminal of the op-amp. Additionally, the capacitors 46 and 48 may be selectively coupled to either the output of the op-amp 44 (i.e. in feedback mode) or to a reference voltage 50 (Vref), via the switches 52 ($S2_{ref}$), 54 ($S2_{out}$), 56 ($S1_{ref}$), 58 ($S1_{out}$). As will be explained further below in reference to FIG. 4, when a capacitor 46 or 48 is coupled to the output of the op-amp 44, the capacitor amplifies the voltage output of the op-amp 44 and stores a charge that is proportional to the pixel charge 32. Conversely, when a capacitor 46 or 48 is coupled instead to the voltage reference 50, the capacitor may behave like an input to the integrator 34, transferring its charge to the capacitor that remains in the feedback loop.

The embodiment shown includes two capacitors. Capacitor 46, C2, is relatively large and provides a corresponding low-gain measurement for measuring high amplitude X-ray signals, while capacitor 48 is relatively small and provides a higher gain measurement for measuring low amplitude X-ray signals. While, for convenience, only two capacitors are shown, in some embodiments, the integrator 34 may include additional parallel capacitors of varying capacitance values so that the gain of the integrator 34 may be programmed to provide a wide range of signal amplifications. In such embodiments, the unused capacitors may be isolated from the integrator 34 through the use of additional switches. Embodiments may include a set of five parallel capacitors with individual values of 0.45, 0.45, 0.9, 1.8, and 7.2 picofarads.

The integrator 34 may also include a reset switch 60 ($S_{reset}$) that is used to reset the integrator 34 to an initial condition wherein the output of the integrator is set to the ground voltage. In some embodiments, the ground voltage may equal −1.0 volts volts, and the reference voltage 50 may equal −1.4 volts.

In the depicted embodiment, the DSA 38 may include an input capacitor 66, $C_{DSA1}$, that stores charge from the integrator 34. The input capacitor 66 is coupled in series to an op-amp 68. The feedback loop of the op-amp 68 includes a feedback capacitor 70, $C_{DSA2}$, coupled to the negative input of the op-amp 68. The ratio of capacitors 66 and 70 will determine the gain of the DSA 38. As with the integrator 34, the DSA 38 may also include several additional feedback capacitors that may be optionally coupled to the feedback loop of the DSA 68 for providing additional gain factors for the DSA 38. The DSA 38 may also include a clamping switch 72, $S_{clamp}$, that holds the output of the DSA 38 at the ground voltage until a reading of the pixel charge is initiated as will be explained below. The output of the op-amp 68 is coupled to the S/H circuit 40. The switches 52, 54, 56, 58, 60, 64, and 72 may be controlled by the control circuitry 24 shown in FIG. 1.

As will be explained further below in reference to FIG. 4, the data module circuitry 20 enables the use of the correlated double sampling method, wherein the pixel charge is compared to a known reference voltage. The correlated double sampling method works well for reducing electronic noise, which is more influential in high-gain/low X-ray intensity measurements. However, the correlated double sampling method does not reduce the inherent quantum noise, which is more influential in the low-gain/high X-ray intensity measurement. Accordingly, the data acquisition circuit 20 enables a series of measurements that provide a high-gain measurement and a low-gain measurement for the same input pixel charge using the correlated double sampling technique. The correlated double sampling technique may be effective for reducing noise in the high-gain measurement.

Figure 4:
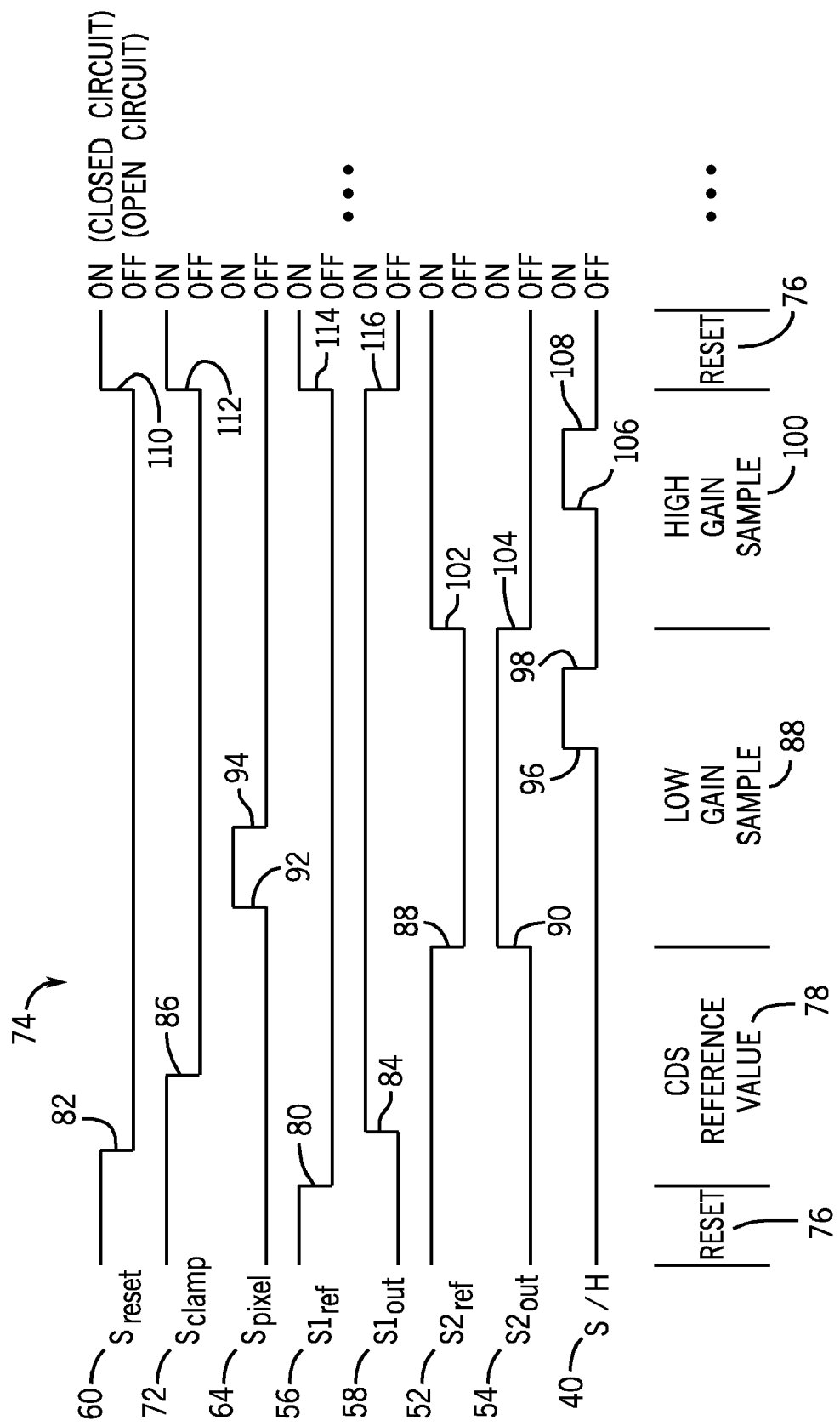
FIG. 4 is a timing diagram illustrating the operation of the circuit shown in FIG. 3 in accordance with aspects of the present invention.

FIG. 4 is a timing diagram illustrating the operation of the data module 20 shown in FIG. 3 in accordance with aspects of the present invention. The timing diagram 74 depicts the state of the switches 52, 54, 56, 58, 60, 64, and 72 during a complete set of measurements for accurately converting the input pixel charge into a corresponding digitized value. The state of each switch is represented by a corresponding signal trace that depicts the switch transitions in time. When the signal is high, the switch is on (i.e. closed). When the signal is low, the switch is off (i.e. open).

The measurement sequence shown by the timing diagram 74 may be divided into four steps. First, at step 76 the data module 20 is reset and prepared for the next input pixel charge 32. During this step, $S_{reset}$ and $S_{clamp}$ are both on (closed), causing the output of the integrator 34 and the DSA 38 to settle to the ground potential. Additionally, $S1_{ref}$ and $S2_{ref}$ are both on (closed) and $S1_{out}$ and $S2_{out}$ are both off (open), causing both of the capacitors 46 and 48 to be decoupled from the feedback loop of the integrator 34 and coupled to the reference voltage 50. Both capacitors 46 and 48 will develop a charge proportional to the reference voltage. Additionally, the S/H circuit 40 and $S_{pixel}$ are both off. During this time the pixel capacitor 62 may hold a charge that corresponds with one of the pixels 28 in the panel 18.

Next, at step 78, the data module 20 is reconfigured to provide the reference measurement for the correlated double sampling technique. During step 78, capacitor 48 is coupled to the feedback loop of the integrator 34, and capacitor 46 remains coupled to the reference voltage 50. To couple the capacitor 48 to the feedback loop, $S1_{ref}$ is first turned on at transition 80, $S_{reset}$ is then turned off at transition 82, and $S1_{out}$ is then turned on at transition 84. This switch transition timing prevents shorting capacitor 48 across the reset switch 60 $S_{reset}$. After coupling capacitor 48 to the feedback loop, the reference voltage 50 in series with capacitor 46 becomes the input of the integrator 34, and the output of the integrator 34 equals the reference voltage 50. Therefore, capacitor 66 will also be charged in proportion to the reference voltage 50.

Next, after coupling capacitor 48 to the feedback loop, the double sampling amplifier 38 is unclamped. Accordingly, the clamping switch 72 ($S_{clamp}$) is turned off at transition 86, allowing the output of the DSA op-amp 68 to rise in response to the future output of the integrator. At this time, the output of the DSA 38 remains at the ground potential and the DSA 38 has obtained the reference measurement for the correlated double sampling technique, i.e., the voltage across the input capacitor 66 equals the reference voltage 50.

Next, at step 88, the data module 20 is configured to measure the input pixel charge 32 from pixel capacitor 62 with a low integrator gain. To reduce the gain of the integrator 34, capacitor 46 is coupled into the feedback loop in parallel with the capacitor 48. Accordingly, switch 52 ($S2_{ref}$) is turned off at transition 88 and switch 54 ($S2_{out}$) is turned on at transition 90. At this time, both capacitor 46 and capacitor 48 are in the feedback, thereby reducing the gain of the integrator 34 and providing a large charge storage capacity for the input pixel charge 32. Next, the pixel switch 64 ($S_{pixel}$) is turned on at transition 92, and the charge held by the pixel capacitor is fed into the integrator 34. After turning on the pixel switch 64 ($S_{pixel}$), the charge from the pixel capacitor 62 will effectively be transferred to the capacitors 46 and 48 and the output of the integrator 34 will change in proportion to the input pixel charge 32. The output of the integrator 34 will also be fed into the DSA 38, whose output will also rise in proportion to the input pixel charge 32. Furthermore, the pixel capacitor 62 will be discharged and may, therefore, be decoupled from the integrator 34 input by turning off the pixel switch 64 ($S_{pixel}$) 1 at transition 94, thus avoiding noise from the panel 18. After turning off the pixel switch 64, the electronics may be connected to the next pixel 28 in the row 26 of pixels in the panel 18.

The low-gain measurement is then captured by the S/H circuitry 40 at transition 96. The analog voltage value measured by the S/H circuit 40 is then converted into a digital value by the ADC 42. As mentioned above, the speed at which the ADC 42 converts the analog sample into a digital value may depend on the starting point of the comparison signal used by the comparator. Therefore, to increase the digital conversion speed, the comparison signal may be started at a relatively high value, because the low-gain measurement is only intended to be used for measuring high X-ray intensity signals. If the low-gain sample is too low, the ADC 42 will under range, i.e. the comparison signal will always be higher than the signal from the S/H circuitry 40, and the ADC 42 will not settle on a digital value. This data may then be ignored in favor of the high-gain measurement that follows during step 100. Additionally, in certain embodiments, the fact that the ADC 42 under ranges may also be used to trigger the data module 20 to proceed to execute the high-gain measurement at step 100 rather than skipping step 100. Finally, the digital value generated by the ADC 42 during step 88 may be sent to the data acquisition circuitry 30, as described above.

In certain embodiments, both the reference measurement and the pixel charge measurement have the same circuit configuration, e.g. the same integrator gain. As seen by the timing diagram, the circuit configuration is not the same for the reference measurement and the low-gain pixel charge measurement. Therefore, the correlated double sampling technique may not be effective for the low-gain measurement. However, as stated above, the correlated double sampling method is of limited use with low-gain measurements, because the noise floor for the low-gain measurement is dominated by quantum noise, not electronic noise. Conversely, the circuit configuration will be the same for the reference measurement and high-gain pixel charge measurement, as seen in the next step.

Next, at step 100, the data module 20 is configured to measure the same input pixel charge 32 from pixel capacitor 62 ($C_{pixel}$), but with a high integrator gain. As stated above, the pixel capacitor 62 has, by now, been discharged and the charge has effectively been transferred to the two integrator capacitors 46 and 48. In order to re-sample the input pixel charge 32 at a higher integrator gain, capacitor 46 may be decoupled from the feedback loop and coupled to the reference voltage 50. Accordingly, switch 52 ($S2_{ref}$) is turned on at transition 102 and switch 54 ($S2_{out}$) is turned off at transition 104. At this time, only capacitor 48 is in feedback, which increases the gain of the integrator 34, and capacitor 46 ($C_2$) is coupled between the input of the integrator 34 and the reference voltage 50. After removing capacitor 46 from the feedback loop, the charge from capacitor 46 will be transferred to the remaining feedback capacitor 48 and the output of the integrator 34 will change in proportion to the transferred charge. The output of the integrator 34 will again be fed into the DSA 38, whose output will change again in proportion to the transferred charge. The output of the DSA 38 is then captured by the S/H circuitry 40 at transition 106. The analog voltage measured by the S/H circuit 40 is then converted into a digital sample by the ADC 42. Unlike the low-gain sample, the comparison signal for the analog-to-digital conversion starts at a relatively low value to prevent the ADC 42 from under ranging. The digital value is then sent to the data acquisition circuitry 30, as described above. In the depicted embodiment, it should be noted that the circuit configuration for the high-gain measurement is identical to the circuit configuration for the reference measurement, therefore the correlated double sampling method will be effective for the high-gain measurement.

Finally, the data module 20 is reset and prepared for the next input pixel charge 32. Accordingly, step 76, repeats. Thus, $S_{reset}$ and $S_{clamp}$ are turned on at transitions 110 and 112 respectively, $S1_{ref}$ is turned on at transition 114, and $S1_{out}$ is turned off at transition 116. The entire process described above may then repeat for measuring the next pixel 28 in the row of pixels 26 from the panel 18.

In some embodiments, process 74 may skip from step 88 to reset step 76, skipping the high-gain measurement at step 100. This may be programmed to occur when the amplitude of the low-gain measurement is high enough to provide a suitable digital value measurement or when the amplitude of the low-gain measurement suggests that increasing the integrator gain would cause the integrator 34 to saturate. The determination regarding whether a second, high-gain measurement may be made by the data acquisition circuitry 30 or the control circuitry 24, after the first, low-gain measurement has been digitized and sent to the data acquisition circuitry 30.

The measurement technique described above offers several advantages. Embodiments of the present technique enable a high-gain measurement and a low-gain measurement to be performed for the same input pixel charge 32. The input pixel charge 32 is initially acquired with large capacitance, preventing possible saturation of the integrator 34 and channel-to-channel crosstalk between the pixel measurement channels. Additionally, for the high-gain measurement, the correlated double sampling technique may be applied to reduce electronic noise. Furthermore, the time required for the sample measurements may be reduced compared to prior methods. For example, as described above, the low-gain sample may be converted into a digital value faster by starting with a relatively high comparison signal, and allowing the ADC 42 to under range. Additionally, the second, high-gain measurement may be skipped if the low-gain measurement yields a suitable digital value.

Figure 5:
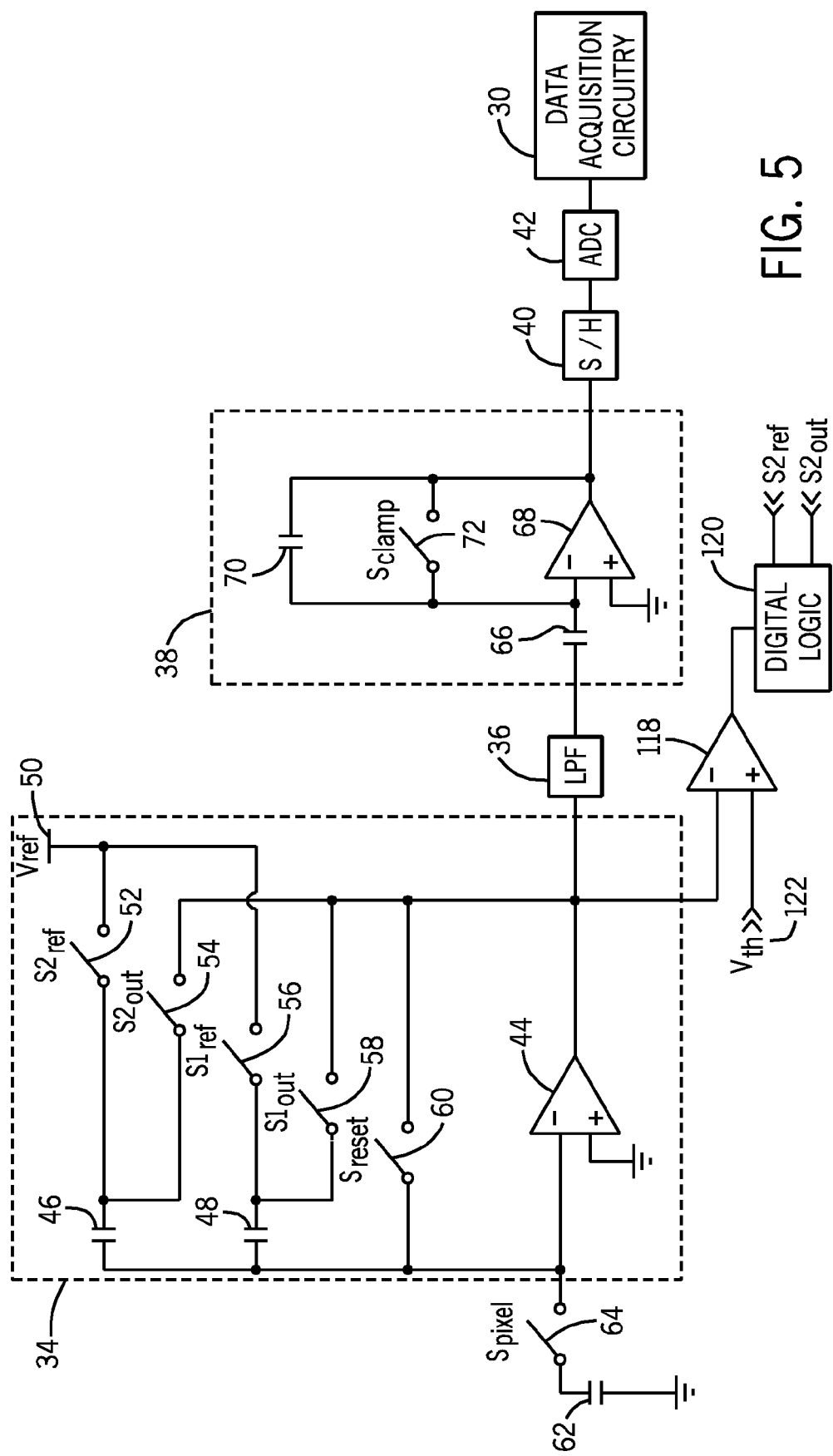
FIG. 5 is another detailed diagrammatic view of the exemplary digital conversion system shown in FIG. 2, illustrating a second technique for reducing noise in accordance with aspects of the present invention.

FIG. 5 is another detailed diagrammatic view of the exemplary data module 20 shown in FIG. 2, illustrating a second technique for reducing noise in accordance with present embodiments. In addition to the circuitry shown in FIG. 3, the data module 20 may also include a comparator 118 and a digital logic circuit 120. The comparator 118 may be coupled to the output of the integrator 34, and may serve to allow a comparison of the integrator 34 output and with a threshold voltage 122 ($V_{th}$). The output of the comparator 118 may then be sent to the digital logic circuit 120, which controls the switches 52 ($S2_{ref}$) and 54 ($S2_{out}$). The digital logic circuit 120 may be included in the control circuitry 24 or may be a stand alone circuit. As will be described further below in relation to FIG. 6, the data module 20 of FIG. 5 enables the gain of the integrator 34 to quickly adapt to the magnitude of the input pixel charge 32. Rather than acquiring a low-gain measurement and a high-gain measurement, as in process 74, only one measurement sample is acquired by the S/H circuitry 40 after the data module 20 determines the appropriate gain factor for the integrator 34.

Figure 6:
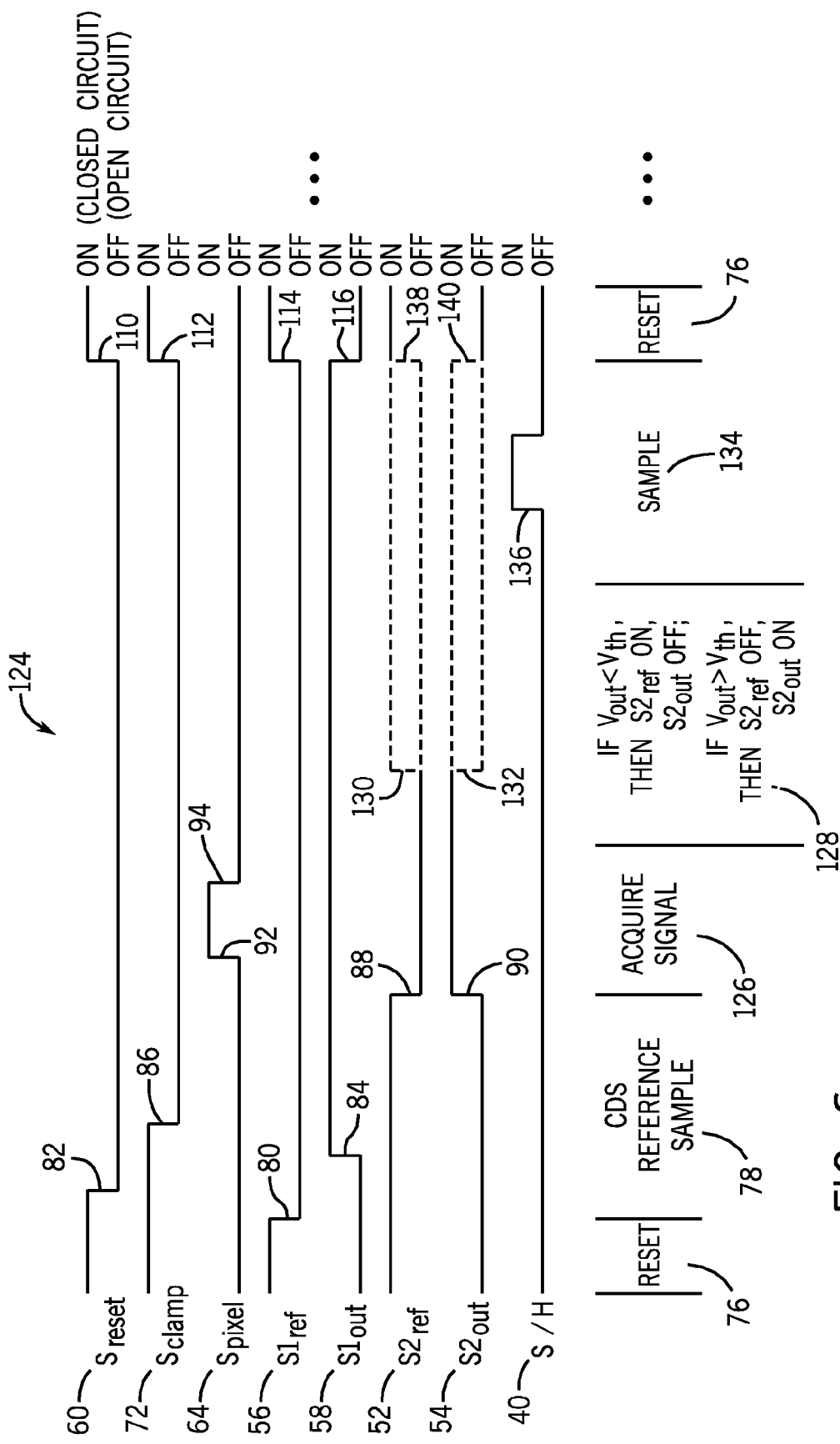
FIG. 6 is a timing diagram illustrating the operation of the circuit shown in FIG. 5 in accordance with aspects of the present invention.

FIG. 6 is a timing diagram illustrating the operation of the data module 20 shown in FIG. 5 in accordance with aspects of the present invention. The measurement sequence shown by the timing diagram 74 may be divided into five steps. The first two steps, steps 76 and 78, may be the same or similar to the first two steps of process 74. Accordingly, as in process 74 describe above, the data module 20 may, at step 76, be reset and prepared for the next input pixel charge 32; and, at step 78, the data module 20 may be reconfigured to provide the reference measurement for the correlated double sampling technique and the double sampling amplifier 38 may be unclamped.

Next at step 126, the data module 20 is configured to measure the input pixel charge from pixel capacitor 62 ($C_{pixel}$) with a low integrator gain. To reduce the gain of the integrator 34, capacitor 46 ($C_2$) is coupled into the feedback loop in parallel with the capacitor 48. Accordingly, switch 52

(S2$_{ref}$) is turned off at transition 88 and switch 54 (S2$_{out}$) is turned on at transition 90. At this time, both capacitor 46 and capacitor 48 are in feedback, thereby reducing the gain of the integrator 34 and providing a large charge storage capacity for the input pixel charge 32 from the pixel capacitor 62 (C$_{pixel}$).

Next, pixel switch 64 (S$_{pixel}$) is turned on at transition 92, and the charge held by the pixel capacitor (C$_{pixel}$) is fed into the integrator. After turning on the pixel switch 64 (S$_{pixel}$), the charge from the pixel capacitor 62 will effectively be transferred to the integrator capacitors 46 and 48 and the output of the integrator 34 will change in proportion to the input pixel charge 32. The output of the integrator 34 will also be fed into the DSA 38, whose output will also rise in proportion to the input pixel charge 32. However, a measurement sample is not acquired at this time. Rather, the output of the integrator 34 (or in another embodiment, the output of the DSA) is also fed into the comparator 118, which is used to determine the integrator gain, as described in step 128.

Accordingly, at step 128, a determination is made regarding whether the gain of the integrator 34 will be increased. If the output of the integrator is below a specified threshold voltage 122 (V$_{th}$) as determined by the comparator 118, then the gain of the integrator 34 is increased. To increase the gain, capacitor 46 may be decoupled from the feedback loop and coupled to the reference voltage 50. In that case, switch 52 (S2$_{ref}$) is turned on at transition 130 and switch 54 (S2$_{out}$) is turned off at transition 132. After increasing the gain, capacitor 48 will be in feedback and capacitor 46 (C$_2$) will be coupled to the input of the integrator 34. As before, the charge from capacitor 46 will be transferred to the remaining feedback capacitor 48 and the output of the integrator 34 and the DSA 38 will change in proportion to the transferred charge. If, however, the output of the integrator is above the specified threshold voltage 122 (V$_{th}$), then the gain of the integrator 34 is kept at the lower value. In that case, both of the capacitors 46 and 48 remain in feedback and no change occurs to the integrator circuit. Therefore, switch 52 (S2$_{ref}$) remains off and switch 54 (S2$_{out}$) remains on.

Next, at step 134, the measurement is then captured by the S/H circuitry 40 at transition 136. The analog voltage value measured by the S/H circuit 40 is then converted into a digital value by the ADC 42 and sent to the data acquisition circuitry 30, as described above.

Similar to the embodiment described in relation to FIGS. 3 and 4, if the gain is high, the circuit configuration for the measurement will be identical to the circuit configuration of the of the reference measurement, therefore the correlated double sampling method may be effective to reduce noise in the measurement. However, if the gain is low, the correlated double sampling technique may not be useful for reducing noise in the measurement.

Finally, step 76 repeats and the data module 20 is reset and prepared for the next input pixel charge 32. Accordingly, S$_{reset}$ and S$_{clamp}$ are turned on at transitions 110 and 112 respectively, S1$_{ref}$ is turned on at transition 114, and S1$_{out}$ is turned off at transition 116. Additionally, if the gain was increased during step 128, S2$_{ref}$ is turned on at transition 138 and S2$_{out}$ is turned off at transition 140. The entire process described above may then repeat for the measuring the next pixel 28 in the row of pixels 26.

The measurement technique described above, in relation to FIGS. 5 and 6 offers several advantages. As in the embodiments discussed in relation to FIGS. 3 and 4, embodiments of the present technique enable a high-gain measurement and a low-gain measurement to be accomplished for the same input pixel charge 32. For the high-gain measurement, the correlated double sampling technique may be effective to reduce electronic noise. Additionally, the input pixel charge is initially acquired with large capacitance, preventing possible saturation of the integrator 34 and channel-to-channel crosstalk between the pixel measurement channels. Additionally, in the embodiments depicted in FIGS. 5 and 6, the time required for the measurements may be further reduced, because only one digital conversion is performed instead of two.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method for converting an analog signal to a digital signal, comprising:
   coupling at least a first capacitor and a second capacitor to an integrator in a feedback configuration;
   receiving an input pixel charge corresponding to the analog signal from at least one of a plurality of pixels of a detector array into the integrator and distributing the input pixel charge to the first capacitor and the second capacitor such that a first integrator output varies in proportion to the input pixel charge;
   providing the first integrator output to a double sampling amplifier for varying a first output of the double sampling amplifier in proportion to the input pixel charge;
   decoupling the input pixel charge from the integrator;
   converting one of the first integrator output and the first double sampling amplifier output to a first digital value;
   changing the coupling of the second capacitor from a feedback configuration to an integrator-input configuration and transferring charge of the second capacitor to the first capacitor such that a second integrator output varies in proportion to the transferred charge;
   providing the second integrator output to the double sampling amplifier for varying a second output of the double sampling amplifier in proportion to the transferred charge;
   converting one of the second integrator output and the second double sampling amplifier output to a second digital value.

2. The method of claim 1, wherein the integrator includes an operational amplifier and wherein a first lead of the first capacitor and a first lead of the second capacitor is coupled to a negative input terminal of the operational amplifier.

3. The method of claim 2, wherein coupling the first capacitor and the second capacitor to the integrator in the feedback configuration comprises coupling a second lead of the first capacitor and a second lead of the second capacitor to an output terminal of the operational amplifier.

4. The method of claim 2, wherein changing the coupling of the second capacitor from the feedback configuration to the integrator-input configuration comprises coupling a second lead of the second capacitor to a reference voltage.

5. The method of claim 1, comprising coupling the first capacitor to the integrator in the feedback configuration, coupling the second capacitor to the integrator in the integrator-input configuration, and acquiring a reference measurement with the double sampling amplifier.

6. A method for converting an analog signal to a digital signal, comprising:

coupling a first capacitor into a feedback loop of an integrator;

coupling a second capacitor in series between an input of the integrator and a reference voltage;

unclamping a double sampling amplifier coupled to output of the integrator;

decoupling the second capacitor from the reference voltage and coupling the second capacitor into the feedback loop of the integrator;

receiving an input pixel charge corresponding to the analog signal from at least one of a plurality of pixels of a detector array into the integrator and distributing the input pixel charge to the first capacitor and the second capacitor such that a first integrator output varies in proportion to the input pixel charge;

converting the first integrator output to a first digital value;

decoupling the second capacitor from the output of the integrator and coupling the second capacitor to a reference voltage and transferring charge of the second capacitor to the first capacitor such that a second integrator output varies in proportion to the transferred charge; and converting the second integrator output to a second digital value.

7. The method of claim 6, wherein converting the first integrator output to the first digital value and converting the second integrator output to the second digital value comprises feeding the integrator output into a double sampling amplifier.

8. The method of claim 7, wherein converting the first integrator output to the first digital value and converting the second integrator output to the second digital value comprises sending the output of the double sampling amplifier to a sample and hold amplifier.

9. The method of claim 8, wherein converting the first integrator output to the first digital value and converting the second integrator output to the second digital value comprises sending the output of the sample and hold amplifier to an analog to digital converter.

10. The method of claim 6, comprising selecting the first capacitor and the second capacitor from a bank of capacitors.

11. A method for converting an analog signal to a digital signal, comprising:

coupling a first capacitor and a second capacitor in parallel in a feedback loop of an integrator;

receiving an input pixel charge corresponding to the analog signal from at least one of a plurality of pixels of a detector array into the integrator and distributing the input pixel charge to the first capacitor and the second capacitor such that a first integrator output varies in proportion to the input pixel charge;

providing the first integrator output to a double sampling amplifier for varying a first output of the double sampling amplifier in proportion to the input pixel charge;

decoupling the input pixel charge from the integrator;

comparing one of the first integrator output and the first double sampling amplifier output to a threshold voltage;

if value of one of the first double sampling amplifier output and the first integrator output is less that the threshold voltage, changing the coupling of the second capacitor from a feedback configuration to an integrator-input configuration and transferring charge of the second capacitor to the first capacitor such that a second integrator output varies in proportion to the transferred charge;

providing the second integrator output to the double sampling amplifier for varying a second output of the double sampling amplifier in proportion to the transferred charge; and converting the second double sampling amplifier output into a digital value corresponding to the analog signal.

12. The method of claim 11, wherein changing the coupling of the second capacitor comprises decoupling the second capacitor from the output of the integrator and coupling the second capacitor to a reference voltage.

13. The method of claim 11, comprising coupling the second capacitor in series between the input of the integrator and a reference voltage, and unclamping the double sampling amplifier coupled to the output of the integrator.

14. The method of claim 11, wherein converting the second double sampling amplifier output into the digital value comprises providing the second double sampling amplifier output to a sample and hold amplifier, and sending the output of the sample and hold amplifier to an analog to digital converter.

15. The method of claim 11, comprising selecting the first capacitor and the second capacitor from a bank of capacitors.

* * * * *